(12) United States Patent
Bentley

(10) Patent No.: US 8,980,531 B2
(45) Date of Patent: Mar. 17, 2015

(54) TRANSPARENT COMPONENTS

(75) Inventor: Philip Gareth Bentley, Cambridgeshire (GB)

(73) Assignee: Conductive Inkjet Technology Limited, Yorkshire (GB)

( * ) Notice: Subject to any disclaimer, the term of this patent is extended or adjusted under 35 U.S.C. 154(b) by 13 days.

(21) Appl. No.: 14/005,034

(22) PCT Filed: Apr. 12, 2012

(86) PCT No.: PCT/GB2012/050806
§ 371 (c)(1),
(2), (4) Date: Sep. 13, 2013

(87) PCT Pub. No.: WO2012/140428
PCT Pub. Date: Oct. 18, 2012

(65) Prior Publication Data
US 2014/0000945 A1   Jan. 2, 2014

(30) Foreign Application Priority Data
Apr. 14, 2011   (GB) .................................. 1106309.6

(51) Int. Cl.
| | |
|---|---|
| C23C 22/63 | (2006.01) |
| H05K 3/10 | (2006.01) |
| G06F 3/045 | (2006.01) |
| H05K 3/28 | (2006.01) |
| H05K 9/00 | (2006.01) |
| H01B 1/02 | (2006.01) |
| H05K 1/09 | (2006.01) |
| B82Y 99/00 | (2011.01) |

(52) U.S. Cl.
CPC ...... *H05K 3/10* (2013.01); *C23C 22/63* (2013.01); *G06F 3/045* (2013.01); *G06F 2203/04103* (2013.01); *H05K 3/28* (2013.01); *H05K 9/0096* (2013.01); *H05K 2201/0108* (2013.01); *H05K 2203/1142* (2013.01); *H01B 1/026* (2013.01); *B82Y 99/00* (2013.01); *H05K 1/09* (2013.01); *Y10S 977/932* (2013.01)

USPC .......... 430/314; 430/319; 430/321; 427/106; 427/126.1; 427/305; 427/306; 977/932

(58) Field of Classification Search
None
See application file for complete search history.

(56) References Cited

U.S. PATENT DOCUMENTS

2011/0279398 A1* 11/2011 Philipp .......................... 345/174

FOREIGN PATENT DOCUMENTS

| EP | 0963146 A1 | 12/1999 |
|---|---|---|
| EP | 1215705 A2 | 6/2002 |
| EP | 2139010 A1 | 12/2009 |
| GB | 0986697 A | 3/1965 |
| GB | 1012224 A | 12/1965 |
| JP | 04-363336 A * | 12/1992 |
| WO | 2005/056875 A2 | 6/2005 |

OTHER PUBLICATIONS

International Search Report and Written Opinion issued in corresponding International Patent Application No. PCT/ GB2012/050806 dated Jul. 10, 2012.
Search Report issued in corresponding Great Britain Patent Application No. 1106309.6 dated May 16, 2011.

* cited by examiner

*Primary Examiner* — John A McPherson
(74) *Attorney, Agent, or Firm* — Morgan, Lewis & Bockius LLP

(57) ABSTRACT

A transparent component comprises a substrate (1) having an interface surface, with a pattern of electrically conductive copper (2) disposed on the interface surface with of the substrate, wherein the copper has a copper sulfide surface coating (3). It is found that copper with a suitably thin coating layer of copper sulfide has reduced visibility compared with uncoated copper, so that the metal pattern is less distracting to a viewer. The component finds application as part of a touch-sensitive display, with the substrate overlying or forming part of the display, with images on the display being visible to a user through the transparent component.

10 Claims, 2 Drawing Sheets

TRANSPARENT COMPONENTS

FIELD OF THE INVENTION

This invention relates to transparent components and concerns an electrically conductive transparent component, e.g. a transparent touch-sensitive component, and a method of making such a component. In this specification, references to transparent mean capable of transmitting at least part of the spectrum of visible light.

BACKGROUND TO THE INVENTION

Touch-sensitive components such as touch screens are an increasingly common feature of opto electronic displays e.g. in items such as computers, mobile phones, etc. Such displays require an electrode on the front surface of the display, which must be substantially transparent, in order not to block light transmission from the display and so to enable the display to perform its intended function. A common approach is to use a transparent conductor such as Indium Tin Oxide (ITO) as this electrode. ITO suffers from a number of drawbacks. It is brittle. It is relatively expensive, due to the scarcity of indium. It has high resistivity (typical layers have a sheet resistivity in the range 100-1000 Ohms per square). The high resistivity means that extra processing steps are required to make connections to the grid. It is difficult to etch, making further processing expensive.

An alternative approach is to use an array or grid of fine metal lines, wires or tracks, forming an electrically conductive mesh micropattern disposed on the front surface of the display as the front electrode. The metal grid may be made with very thin wires, e.g. less than 10 micron in width, using standard photolithographic processing. Provided sufficiently large gaps are left between the fine wires of the grid, the wires block very little of the light from the display, and the wires not readily visible to the eye.

A metal grid is malleable, allowing the use of flexible substrates. Thin copper layers typically have a sheet resistivity in the range of 100 mOhms per square. The low resistivity means that bulk metal connections to the grid can be made using the same layer as the fine mesh, reducing the number of processing steps (and hence cost).

A drawback of using metal wires is that the reflective nature of the metal can make the mesh highly visible to a user, which is undesirable.

WO 2009/108758 of 3M concerns touch screen sensors with such conductive micropatterns, and discloses a number of methods of reducing the visibility of a metallic mesh.

The present invention concerns an alternative approach to reducing the visibility of a copper mesh.

There is a good deal of prior art on blackening treatments for copper and copper alloys. Historically brass optical devices such as telescopes were blackened to reduce internal reflections either by the use of matt black paint, or by oxidising processes to produce thick opaque layers. Recently the manufacture of plasma display panels (PDPs) has required the use of fine metal grids to reduce electromagnetic emissions. These are blackened to reduce visibility to the user.

U.S. Pat. No. 2,460,896 discloses a method of blackening copper-based optical components using a mixture of sodium chlorite and sodium hydroxide. The specification notes that "Heretofore, copper and copper alloy surfaces have been blackened by the so-called 'oxidising process' in which the surface is cleaned and a copper sulfide film is formed by immersing the surface in solutions of sodium sulfide or ammonium sulfide or other water soluble sulfides. This produced brown or black coatings on the surface.".

JP2005139546 discloses the use of an electrolytic solution of cobalt sulfate to form a resilient black surface layer on copper foil and copper mesh suitable for a PDP.

Other recent examples, e.g. JP 2010010179, JP2009231426, use the electrolytic deposition of a black nickel-tin oxide to achieve the same result.

JP2009218368 uses electrolytic deposition of copper oxide from a solution of sodium hydroxide or potassium hydroxide to deposit a layer of copper oxide of 0.6 to 3 micron in thickness. This surface treatment is applied to printed circuit boards in particular.

EP 0963416 discloses a transparent member for use as a shield against electromagnetic waves with a copper layer having a brown to black coloured surface layer e.g. of copper sulfide. The thickness of the surface layer is not disclosed and the issue of regulation and control of the thickness is not addressed.

GB 1012224 discloses a transparent electronically conductive film in which a cadmium sulfide layer 250 Angstroms thick is converted to copper sulfide.

GB 986697 discloses preparation of transparent electrically conducting copper sulfide films by contacting a copper film with a sulfur-containing gas.

SUMMARY OF THE INVENTION

In one aspect, the present invention provides a transparent component, comprising a substrate having an interface surface, a pattern of electrically conductive copper disposed on the interface surface of the substrate, wherein the copper has a copper sulfide surface coating.

The term "copper sulfide" is used in this specification to refer to any of the compounds of copper and sulfur, without limitation to any specific ratio, and including non-stoichiometric compounds. Examples of copper sulfide compounds include, but are not limited to, $Cu_2S$, $CuS$ and $CuS_2$. The term "copper sulfide" also covers mixtures of two or more such compounds.

It is found that copper with a suitably thin coating layer of copper sulfide has reduced visibility compared with uncoated copper, so that the metal pattern is less distracting to a viewer. When the copper sulfide layer is in the order of the wavelength of visible light or less (typically less than about 750 nm), the optical appearance of the copper sulfide layer is dominated by thin-film interference effects rather than pigmentation, i.e. a significant portion of the incident light is not absorbed by the material.

In particular, the interference effect due to reflections from the upper and lower surfaces of the copper sulfide coating causes the copper to appear darker, having a deep blue colour, and hence to be less visible.

A metallic copper film will absorb blue light falling on it, while light at longer wavelengths is reflected (hence the reddish appearance of pure copper). If the surface sulfide layer is sufficiently thin (less than the wavelength of visible light and preferably about a quarter of a wavelength of red light), then red light falling on the surface will destructively interfere due to the reflections from the upper and lower surface interfaces. Hence the film will appear to darken to a deep blue colour and be less visible. If the sulfide layer is thicker than the crucial thickness, the red light will cease to destructively interfere and the copper appearance of the film then returns.

For thicker copper sulfide layers, thicker than about 750 nm, the optical appearance of the layers is dominated by significant optical absorption and such layers develop a dark and matt appearance.

Production of copper sulfide layers thicker than about 750 nm would require the consumption of several hundred nanometers (or more) of the underlying copper layer. However, when the underlying copper layer is in the submicron range such a consumption would adversely affect the conductivity of the layer. It is therefore more desirable to exploit the interference colours which may be obtained by producing far thinner layers of the copper sulfide material.

It is thus preferred that the copper sulfide coating has a thickness of about a quarter of a wavelength of red light, which has a wavelength in the range 500 to 700 nm, with the preferred thickness depending on the refractive index of the copper sulfide. Thus, desirably the coating has a thickness ≤200 nm, preferably ≥50 nm, i.e. in the range 50 to 200 nm, conveniently ≤150 nm and preferably ≥100 nm, i.e. in the range 100 to 150 nm. For copper sulfide with a refractive index of 1.4, the preferred thickness is about 100 nm.

In this case, close control of the thickness of the sulfide coating is required, and this is addressed by the present invention.

The copper sulfide surface coating can thus reduce the apparent visibility to a user of the underlying copper, without adversely affecting the electrical conductivity and without adversely affecting the light transmission properties of the components.

The substrate comprises transparent material, and may be rigid or flexible. Suitable substrates include glass and plastics materials e.g. polyethylene terephthalate (PET), polyethylene naphthalate (PEN) and polycarbonate. The substrate is conveniently a flexible plastics material, e.g. of PET or PEN, for ease of processing, either as individual pieces or in the form of a continuous web, with individual components being separated from the web after processing.

The substrate is typically of planar form, e.g. in the form of a sheet, film, layer or elongate web, with the touch interface surface on one face thereof.

The pattern of electrically conductive copper is such as to provide a transparent component. Thus, the copper is typically in the form of an array or grid of fine metal lines, wires or tracks, forming an electrically conductive mesh micropattern. The copper is typically in the form of arrays of parallel lines, e.g. with two transverse arrays, such as perpendicular arrays, defining a grid of square or rectangular openings between the lines. Hexagonal grids and other patterns may also be adopted.

The copper is typically in the form of fine lines, wires or tracks, each having a width of up to about 10 μm, with the lines etc. suitably spaced apart by a distance of many times the width, e.g. at least about 10 times the width, i.e. at a spacing of at least about 100 μm, or substantially more widely spaced e.g. about 20 times the width, i.e. of a spacing of at least about 200 μm. With such arrangements the copper covers only a very small percentage of the surface area of the substrate surface and so does not significantly reduce the light transparency of the component.

The thickness of the copper layer is not critical to performing the invention. A thin copper sulfide layer can be grown on any copper layer as long as it is sufficiently thick to supply the required material needed to be consumed when producing the layer. However, when the copper layer is quite thin, most blackening processes do not yield desirable results because they consume too much copper (percentage wise) and would result in a significant loss of conductivity. In this case the blackening process needs to be such that it is highly controllable and able to produce sulfide layers of such thickness that impart blackening properties to the surface without consuming a significant amount of copper in a way that would impede conductivity. This control is achieved with the method of the invention.

The component and the substrate are both transparent, i.e. capable of transmitting at least part of the spectrum of visible light. Light transmission levels need not be 100% for an item to be considered transparent; indeed the presence of the copper/copper sulfide pattern on the substrate means that the component inevitably does not have 100% light transmission. The term "transparent" in the context of this application refers to light transmission of preferably greater than 50%, more preferably greater than 75% and yet more preferably greater than 85%.

Fine copper lines may be produced on the substrate by a variety of techniques, e.g. as discussed in WO 2009/108758 on pages 20 to 24, including laser cured masking, inkjet printing, gravure printing, micro-replication and micro-contact printing.

One method which may be used to produce copper features is by electroless deposition, which typically produces copper layers with a thickness in the submicron range.

In this method a patterned catalytic layer is first deposited on the substrate by one of the standard techniques. This can include patterned deposition (e.g. by inkjet printing, flexographic printing etc.) or conventional lithography such as photolithography where a continuous layer is deposited (by spin-coating, gravure-coating, dip-coating etc.) and then patterned (e.g. by photolithography). After development, a patterned layer of catalyst remains on the substrate surface. The substrate is then immersed in electroless plating solution and metal deposits on the surface of the catalytic layer. Suitable techniques and materials are disclosed, e.g. in WO 2005/056875. In particular, it is preferred to deposit on the substrate a continuous layer of a curable activator material, e.g. as disclosed in WO 2005/056875, which is then patterned by contact photolithography using ultraviolet light, to produce a desired micro pattern with subsequent development, to produce a desired micropattern of fine lines, e.g. up to 10 mm wide, of activator material. The substrate is then immersed in electroless plating solution to deposit a layer of copper on the patterned activator. Such techniques are well suited to continuous processing of elongate webs of flexible substrate.

The copper sulfide coating is conveniently produced by contacting the copper surface with a solution of sulfide, e.g. a Group 1 metal sulfide such as sodium sulfide, potassium sulfide etc. The sulfide is preferably in an alkaline solution, to reduce the emission of hydrogen sulfide gas. The sulfide is conveniently in solution in a hydroxide, e.g. being in solution in sodium hydroxide, potassium hydroxide etc. Contact is conveniently achieved by immersion in the sulfide solution.

On exposure to the sulfide solution, a layer of copper sulfide forms on the surface of copper, with the copper sulfide layer thickness increasing with time. In order to produce a copper sulfide layer of desired thickness, the exposure conditions should be carefully controlled. Appropriate reaction times to produce a copper sulfide layer of desired thickness, e.g. 100 to 150 nm, will depend of reagent concentrations and can be tailored to suit circumstances. Suitable reaction conditions can be readily determined by experiment.

After the desired exposure time, the reaction is conveniently stopped by rinsing, e.g. immersion, in an oxidising agent, conveniently a sodium hypochlorite solution. Other suitable oxidising agents include hydrogen peroxide, potassium permanganate and ozone. This approach provides good control of the sulfide reaction and hence copper sulfide thickness and colour, and constitutes a simple, effective way to prevent further colour change once the desired colour has been produced. Using an oxidising agent stops the sulfide-generating reaction very rapidly, enabling close control of the sulfide thickness, in a way that is not possible with rinsing with water. This step is preferably followed by a final rinse in de-ionised water.

On exposure of copper to sulfide solution, the initial colour change is from the plain copper colour to a deep blue appearance. Longer immersion causes the appearance of the sample to change to a silver-grey colour, before reverting to a reddish copper appearance.

The colour change, and particularly the reversion of the colour to a metallic appearance with time, indicate that the copper sulfide is growing in a thin layer on top of the copper film. A metallic copper film will absorb blue light falling on it, while light at longer wavelengths is reflected (hence the reddish appearance of pure copper). If the surface sulfide layer is sufficiently thin, ideally about a quarter of a wavelength, then red light falling on the surface will destructively interfere due to the reflections from the upper and lower surface interfaces. Hence the film will appear to darken to a deep blue colour and be less visible. If the sulfide layer is thicker than the crucial thickness, the red light will cease to destructively interfere and the copper appearance of the film then returns.

Our method allows the use of substantially thinner films than previous methods of to reducing reflections using sulfide treatments. In these treatments thick layers of copper or copper alloy are treated with sulfide compounds at elevated temperatures for a substantial period. This causes a thick layer of copper sulfide to form, which produces an opaque black colour.

For individual samples, immersion can be achieved by dip coating. For a flexible substrate web, controlled immersion can be conveniently achieved by passing the web through tanks of suitable solutions, using fluidic bearings to isolate the web from the bearing surface and eliminate the likelihood of damage to the substrate surface.

The copper remains electrically conductive after formation of the copper sulfide coating.

The component of the invention may be a touch-sensitive component, with the interface surface of the substrate being a touch interface surface.

The component finds application in displays e.g. touch-sensitive displays, with the substrate overlying or forming part of a display, with images on the display being visible to a user through the transparent component. The invention thus includes within its scope a display, e.g. a touch-sensitive display, comprising a component in accordance with the invention.

Such displays may be used in a wide variety of devices, particularly opto electronic devices, such as computers, mobile phones, etc.

Other applications of the component of the invention include use as a front electrode, e.g. in an LED panel, as a shielding electrode for a plasma or other display, as a heating element, e.g. in a vehicle windscreen, motor cycle visor etc.

The invention includes within its scope a device comprising a component or a display in accordance with the invention.

The approach of the invention may be applied to an existing transparent component having a pattern of electronically conductive copper disposed on the interface surface of a substrate, by treating the exposed copper surface to produce a surface coating of copper sulfide.

The invention thus provides a method of treating a transparent component comprising a substrate having an interface surface with a pattern of electrically conductive copper disposed on the interface surface, comprising treating the exposed surface of the copper to produce a surface coating on the copper of copper sulfide.

Treatment is conveniently carried out as set out above, e.g. by contact with, e.g. immersion in, a solution of a sulfide, preferably a Group 1 metal sulfide, preferably in alkaline solution e.g. in solution in a hydroxide, under suitable conditions, e.g. of concentration, time and temperature, to produce a copper sulfide coating of desired thickness. The reaction is conveniently stopped by removal of the sulfide solution and contact with, e.g. immersion in, an oxidising agent such as a sodium hypochlorite solution, hydrogen peroxide, potassium permanganate or ozone, enabling precise control of reaction time and hence coating thickness. This is preferably followed by a final rinse in de-ionised water.

The invention also provides a method of treating a transparent component comprising a substrate having an interface surface with a pattern of electrically conductive copper disposed on the interface surface, comprising treating the surface of the copper with a sulfide solution which reacts to produce a surface coating of copper sulfide on the copper, and stopping the reaction by contact with an oxidising agent.

The approach of the invention may also be applied to production of a transparent component.

Thus, in a further aspect, the invention also provides a method of making a transparent component, comprising producing a pattern of electrically conductive copper on a surface of a substrate, and treating the exposed surface of the copper to produce a surface coating of copper sulfide on the copper.

The invention also provides a method of making a transparent component, comprising producing a pattern of electrically conductive copper on a surface of a substrate, treating the surface of the copper with a sulfide solution which reacts to produce a surface coating of copper sulfide on the copper, and stopping the reaction by contact with an oxidising agent.

The pattern of electrically conductive copper, which is typically a micropattern as discussed above, may be produced in a variety of ways, e.g. as set out above. For example, a continuous layer of a curable activator material, e.g. as disclosed in WO 2005/056875, is deposited on the substrate, with the desired micropattern being produced by contact photolithography. This is followed by electroless deposition of copper, e.g. as disclosed in WO 2005/056875. Subsequent processing to produce a copper sulfide surface coating on the copper is conveniently as set out above.

The invention will be further described, by way of illustration, in the following examples, and with reference to the accompanying drawings, in which.

DETAILED DESCRIPTION OF THE DRAWINGS

Figure 1:
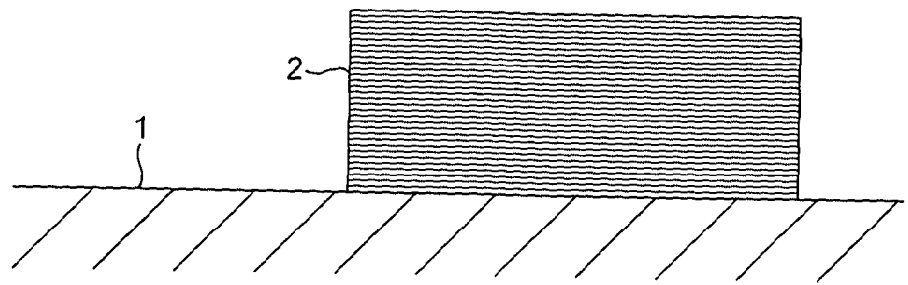
FIG. 1 illustrates schematically a substrate carrying a copper wire.

FIG. 1 shows schematically and not to scale a portion of a transparent component comprising a portion of a transparent substrate 1 that carries a pattern of electrically conductive copper, as represented by copper wire 2.

Figure 2:
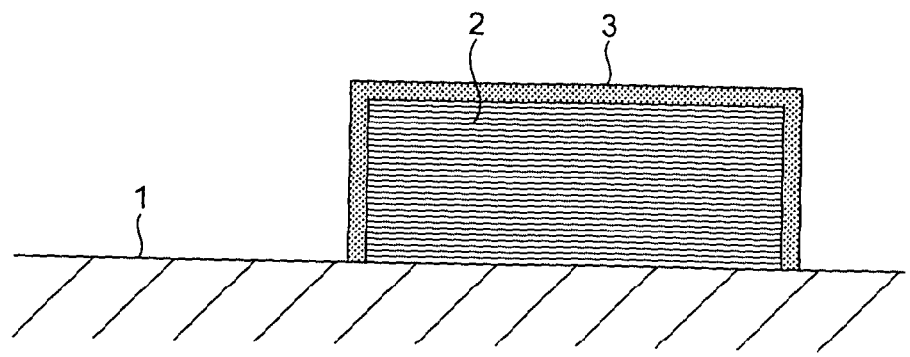
FIG. 2 is a drawing similar to FIG. 1, with the copper wire having a surface coating of copper sulfide.

FIG. 2 shows the component of FIG. 1 after treatment by the method of the invention, resulting in formation of a layer of copper sulfide 3 on the surface of the copper wire 2.

EXAMPLE 1

A fine mesh of copper wires was formed on a substrate comprising a film of transparent PET in the form of PMX726 PET film, 50 micron thick, available from HiFi Films. A continuous layer of curable catalyst material was deposited on one surface of the film, by using the following photosensitive catalyst formulation:

|  | Wt % |
|---|---|
| Ethyl lactate | 72.3 |
| DPHA | 7 |
| Irgacure 907 | 0.7 |
| Pd/PVP K15 colloid | 20 |

Irgacure 907 (Irgacure is a Trade Mark) is a photoiniator material. DPHA is dipentaerythritol hexacrylate, a UV-curable hexafunctional monomer. Pd is a catalyst and is present in the form of a polyvinyl pyrrolidone (PVP)-based colloid having the following formation:

|  | Wt % |
|---|---|
| Ethyl lactate | 91 |
| Palladium acetate | 4.5 |
| PVP K15 | 4.5 |

A base layer of the catalyst formulation was applied to one surface of the substrate using a 12 micron drawdown bar and then dried on a hot plate at 50° C. for five minutes. The layer was then cured using a 1 kW mercury lamp. This was to ensure a compatible surface energy for the subsequent coating.

An active layer of the same catalyst formation was then coated on top of the base layer using the same technique, with drying but no curing.

The active layer was then patterned by contact photolithography using ultraviolet light, with subsequent development, to produce a grid pattern of catalyst material. In particular, the layer was exposed to UV light using a 1 kW mercury lamp for 10 seconds at 20 mW/cm$^2$ Developing was carried out using DMSO/acetone (50/50). The substrates were immersed for 5 minutes in DMSO/acetone, rinsed with acetone from wash bottle, rinsed with deionised (DI) water from wash bottle, and blown dry with an air gun. This selectively removes unexposed regions of the active layer, to leave the desired grid pattern.

Electroless plating was used to deposit a thin (submicron) layer of copper on the patterned catalyst layer. Electroless plating was carried out using immersion for 10 minutes in Entrace EC 5005 plating chemistry available from Enthone (Entrace is a to Trade Mark). This resulted in formulation on the substrate of a copper grid consisting of 10 micron wide lines at a pitch of 500 microns. This method typically produces a copper layer approximately 300 nm to 600 nm thick. At this stage, the grid had a bright copper coloured surface and was visible to the naked eye. The samples had a transmission of greater than 95% of incident light.

A sample was then immersed in an aqueous solution consisting of 0.75 g/l sodium sulfide and 1 g/l sodium hydroxide for 5 seconds at room temperature (about 18° C.). This caused a layer of copper sulfide believed to be about 100 nm thick to form on the surface of the copper, resulting in a change in colour to a deep blue-black colour. The sample was immediate immersed in an aqueous solution of 2.5 g/l sodium hypochlorite to prevent further reaction. The sample was then rinsed in de-ionised water and dried. The metallic lustre of the untreated copper grid was no longer visible, and the visual appearance of the grid was markedly reduced. The copper grid retained electrical continuity throughout. The light transmission of the sample was greater than 95%.

Experiments showed that the copper sulfide layer becomes thicker the longer the samples are immersed in the sodium sulfide solution. For example, repeating the process described above but with immersion in sulfide solution for 10 seconds resulted in the copper grid having a reddish surface colour with a metallic lustre that was visible under strong light. Such a grid is therefore less useful for display applications.

The reaction speed depends on factors including reagent concentration and temperature, and reaction conditions can be tailored to suit requirements. For example, for reel-to-reel processes, a reaction time of about 5 seconds is suitable, so the sulfide reagent concentrations used above are suitable.

EXAMPLE 2

Since the goal of the darkening treatment is to produce a sulfide film which minimises the red-tinged reflection from the copper metal by favouring the reflection of blue light instead, a useful metric for the quality of the applied treatment is the ratio of the intensity of reflected light in the blue and red regions of the visible spectrum. When the sulfide layer is too thin or too thick, there will be relatively little blue light reflected and red light, either from the colour of the copper metal or from a red interference colour, will be clearly discernible. Conversely, when the thickness of the sulfide layer is optimum, the amount of red light reflected will be minimised and the reflection associated with the interference colour of the sulfide layer will be in the blue region of the visible spectrum.

In order to quantify the quality of the darkening and provide a measurable figure of merit, a dark-field microscope with a colour CCD camera was used. The use of dark-field is preferable since it minimises the white specular reflection from the surface of the PET film and therefore improves the signal to noise ratio of the technique. A colour image of a darkened sample can be split into separate red, green and blue colour planes. By extracting the intensity histogram for each of these planes and summing the total of each histogram, it is possible to extract a measure of the relative amount of reflected light for each colour. The ratio of the total blue reflection to the total red reflection will then give a figure of merit for the quality of the darkening process.

Seven identical samples were obtained from a fine mesh of copper wires (5 μm wide) formed on a transparent PET substrate through electroless plating as described in Example 1 above. The resistivity of the plated samples was measured to be 50 mΩ/□ which, assuming it had the resistivity of bulk copper, would yield a bulk copper equivalent thickness of 336 nm. The electroless plated copper layer that was deposited does, however, have a slightly higher resistivity than that of bulk copper.

Six of the samples were immersed in a sulfide bath containing 0.25 g/l sodium sulfide nonahydrate and 1 g/l sodium hydroxide at room temperature (about 18° C.) for various amounts of time. These were 4, 6, 8, 15, 30 and 60 seconds respectively. Upon completion of the immersion time in the sulfide bath, all samples were each taken out and immediately immersed in a 2.5 g/l sodium hypochlorite bath at room temperature (about 18° C.) for 10 seconds followed by a rinse with de-ionised water and drying.

Subsequently all seven samples were imaged using a dark-field microscope and a colour CCD camera. The colour images obtained were split into the colour planes and the ratio of the intensity of the blue plane over the intensity of the red plane is recorded in the table below.

| Sulfide bath immersion time (sec) | Colour intensity ratio (B/R) |
|---|---|
| 0 | 0.29 |
| 4 | 0.31 |
| 6 | 0.62 |
| 8 | 0.52 |
| 15 | 0.48 |
| 30 | 0.44 |
| 60 | 0.39 |

Figure 3:
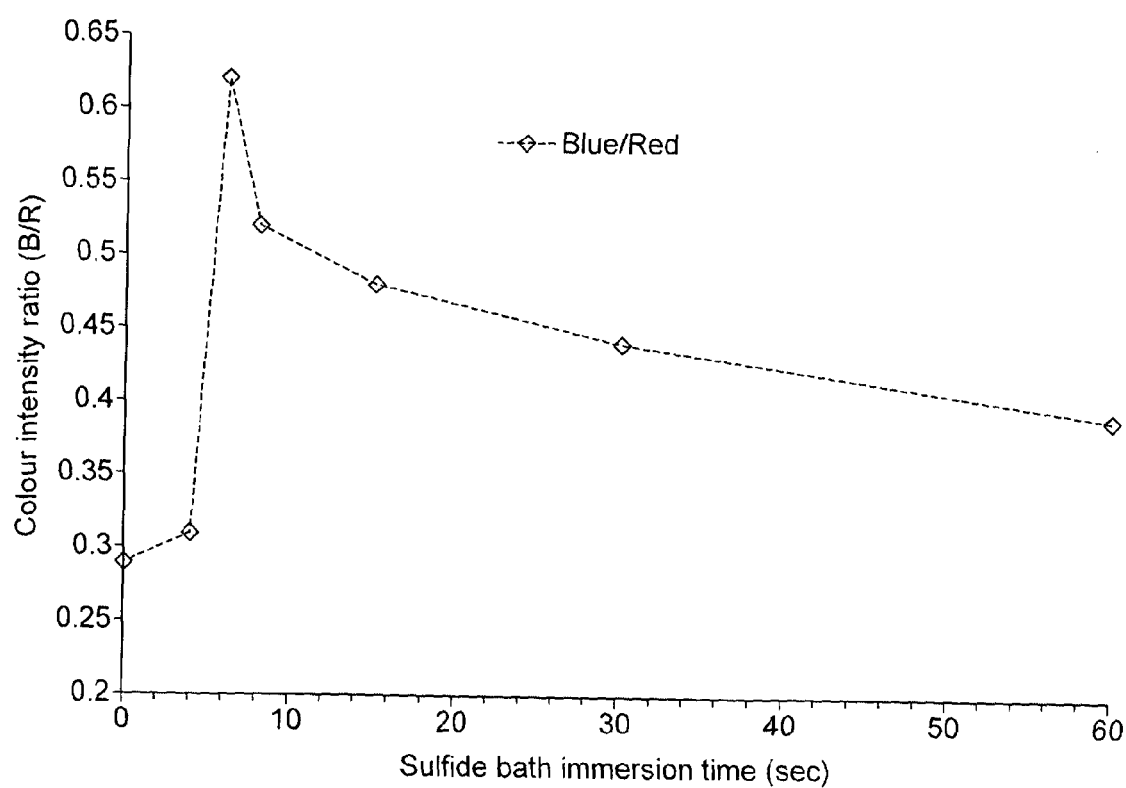
FIG. 3 is a graph of colour intensity ratio (blue plane/red plane) versus sulfide bath immersion time (in seconds).

FIG. 3 shows a plot of the blue/red ratio as a function of treatment time for each samples. The measurement at zero seconds (0 s) was obtained on the un-blackened seventh sample. At very short times (<5 seconds) the blue/red ratio is very low and for these samples the mesh looks red in appearance. At much longer times (e.g. >15 seconds) the sulfide layer is too thick and again blue/red ratio is again relatively low (<0.5). For intermediate times, the blue/red ratio is relatively high (>0.5) and the samples appear dark blue in colour. For the samples with a high blue/red ratio (>0.5), the copper sulfide layer is believed to have a thickness in the range about 100 nm to about 150 nm.

The invention claimed is:

1. A method of treating a transparent component comprising a substrate having an interface surface with a pattern of electrically conductive copper disposed on the interface surface, comprising treating the surface of the copper with a sulfide solution which reacts to produce a surface coating of copper sulfide on the copper, and stopping the reaction by contact with an oxidising agent.

2. A method according to claim 1, wherein the copper sulfide coating has a thickness in the range of about 50 to 200 nm.

3. A method according to claim 2, wherein the copper sulfide coating has a thickness of less than about 150nm.

4. A method according to claim 3, wherein the copper sulfide coating has a thickness of about 100 nm.

5. A method according to claim 1, wherein the substrate comprises flexible plastics material.

6. A method according to claim 1, wherein the copper is in the form of fine lines, wires or tracks, having a width of up to about 10 µm.

7. A method according to claim 1, wherein the component is touch-sensitive.

8. A method of making a transparent component, comprising producing a pattern of electrically conductive copper on a surface of a substrate, treating the surface of the copper with a sulfide solution which reacts to produce a surface coating of copper sulfide on the copper, and stopping the reaction by contact with an oxidising agent.

9. A method according to claim 8, wherein the pattern of electrically conductive copper is produced by depositing a continuous layer of a curable activator material on the substrate, followed by contact photolithography to produce the pattern.

10. A method according to claim 9, wherein copper is deposited on the activator pattern by electroless deposition.

* * * * *